United States Patent
Kruit et al.

(10) Patent No.: US 12,412,727 B2
(45) Date of Patent: Sep. 9, 2025

(54) CHARGED PARTICLE BEAM SYSTEM, CORRECTOR FOR ABERRATION CORRECTION OF A CHARGED PARTICLE BEAM, AND METHOD THEREOF

(71) Applicant: ICT Integrated Circuit Testing Gesellschaft für Halbleiterprüftechnik mbH, Heimstetten (DE)

(72) Inventors: Pieter Kruit, Delft (NL); John Breuer, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 405 days.

(21) Appl. No.: 17/991,168

(22) Filed: Nov. 21, 2022

(65) Prior Publication Data
US 2024/0170249 A1    May 23, 2024

(51) Int. Cl.
*H01J 37/153* (2006.01)
*G01N 23/2251* (2018.01)
*H01J 37/147* (2006.01)
*H01J 37/28* (2006.01)

(52) U.S. Cl.
CPC ........ *H01J 37/153* (2013.01); *G01N 23/2251* (2013.01); *H01J 37/1472* (2013.01); *H01J 37/28* (2013.01); *G01N 2223/079* (2013.01); *G01N 2223/418* (2013.01); *G01N 2223/507* (2013.01); *H01J 2237/151* (2013.01); *H01J 2237/1534* (2013.01)

(58) Field of Classification Search
CPC .......... H01J 37/00; H01J 37/02; H01J 37/153; H01J 37/1472; H01J 37/26; H01J 37/28; H01J 2237/151; H01J 2237/1534; G01N 23/2251; G01N 2223/079; G01N 2223/418; G01N 2223/507
USPC ......................................... 250/306, 307, 311
See application file for complete search history.

(56) References Cited

U.S. PATENT DOCUMENTS

2009/0212213 A1*  8/2009  Nakasuji ................. H01J 37/28
                                                            250/442.11
2016/0056011 A1*  2/2016  Khursheed ............ H01J 37/153
                                                            250/396 ML

OTHER PUBLICATIONS

Ibanez, F. et al., "Can a Programmable Phase Plate serve as an Aberration Corrector in the Transmission Electron Microscope (TEM)?" submitted on May 16, 2022, 9 pages downloaded from https://arxiv.org/abs/2205.07697?context=physics.

* cited by examiner

*Primary Examiner* — Jason L McCormack
(74) *Attorney, Agent, or Firm* — Kilpatrick Townsend & Stockton LLP (57) ABSTRACT

A corrector for correcting aberrations of a charged particle beam in a charged particle beam device is described. The corrector includes a plurality of wires configured to be in a plane perpendicular to a beam axis. The wires forming two or more openings for passing of the charged particle beam through the two or more openings. The plurality of wires includes at least a first wire having a first connector configured to provide a first voltage to the first wire and a second wire having a second connector configured to provide a second voltage to the second wire. The second voltage being different than the first voltage.

22 Claims, 6 Drawing Sheets

CHARGED PARTICLE BEAM SYSTEM, CORRECTOR FOR ABERRATION CORRECTION OF A CHARGED PARTICLE BEAM, AND METHOD THEREOF

TECHNICAL FIELD

Embodiments described herein relate to correctors for correction of aberrations of a charged particle beam in a charged particle beam system, for example in an electron microscope, particularly in a scanning electron microscope (SEM). Specifically, embodiments of the present disclosure relate to correctors for correction of spherical aberration of a charged particle beam. Embodiments further relate to charged particle beam systems for inspecting and/or imaging a sample that are, for example, configured for any of the methods described herein. Embodiments further relate to methods for correcting aberrations of a charged particle beam in a charged particle beam system. Specifically, embodiments relate to methods for correcting spherical aberrations of a charged particle beam.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Apparatuses using charged particle beams, such as scanning electron microscopes (SEM), have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and/or inspect a sample.

Reliably inspecting and/or imaging samples with a charged particle beam system at a good resolution is challenging because the charged particle beam may suffer from beam aberrations that limit the resolution. Aberration correctors can be provided for at least partially compensating aberrations of the charged particle beam, such as spherical aberrations, astigmatism, and/or chromatic aberrations. An aberration-corrected charged particle beam can provide a smaller probe focus and hence a better resolution as compared to an uncorrected beam.

Several methods for correcting aberrations of a charged particle beam in electron microscopes have been described. For example, correcting aberration of an annular focused charged-particle beam with a corrector structure, wherein the corrector structure comprises a plurality of lenses configured for reducing third-order geometric aberration in the charged-particle beam.

In view of the above, it is beneficial to provide methods of correcting aberrations of charged particle beam by a focusing lens in a charged particle beam system. Further, it is beneficial to provide a charged particle beam system for inspecting and/or imaging a sample that is configured for being operated in accordance with any of the methods described herein. Further, it is beneficial to provide a corrector for correction of aberration of a charged particle beam.

SUMMARY

In light of the above, a corrector for correcting aberrations of a charged particle beam, a charged particle beam system configured to correct aberration of a charged particle beam and a method of correcting aberration of a charged particle beam are provided according to the independent claims.

According to an embodiment, a corrector for correcting aberrations of a charged particle beam in a charged particle beam device is described. The corrector includes a plurality of wires configured to be in a plane perpendicular to a beam axis. The wires forming two or more openings for passing of the charged particle beam through the two or more openings. The plurality of wires includes at least a first wire having a first connector configured to provide a first voltage to the first wire and a second wire having a second connector configured to provide a second voltage to the second wire. The second voltage being different than the first voltage.

According to an embodiment, a charged particle beam apparatus is described. The charged particle beam apparatus including a sample stage, a charged particle source adapted to generate a charged particle beam; and a charged particle beam manipulation system including an aberration corrector according to embodiments described herein.

According to an embodiment, a method of correcting spherical aberrations with a corrector is described. The method includes providing a plurality of voltages to a plurality of wires to generate an electrical field that approximates a first proportionality to a distance to an axis, a second proportionality to the third power of a distance to the axis and having rotational symmetry around the axis, generating a charged particle beam and guiding the charged particle beam along the axis through two or more openings provided by the plurality of wires.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Correctors for spherical aberration correction are disclosed. The correctors can include either line deflectors, a combination of line deflectors with an octupole, or cylindrical deflectors, for example, concentric cylindrical deflectors, in order to correct for the spherical aberration of circular lenses. Throughout this disclosure, circular lenses are considered to be one of electrostatic, magnetic or a combined electrostatic-magnetic lense. Spherical aberration of circular lenses limits the resolution and throughput in charged particle microscopes. Charged particle microscopes can, for example, be electron microscopes. Embodiments of the present disclosure can be utilized in micro-electromechanical systems (MEMS). Correctors can be based on MEMS implemented deflectors for spherical aberration correction. Deflectors can, for example, correspond to wires, particularly a pair of wires. During operation, deflectors can correspond to charged wires.

According to an embodiment, a corrector for correcting aberrations of a charged particle beam in a charged particle beam device is described. The corrector including a plurality of wires configured to be in a plane perpendicular to a beam axis, the wires forming two or more openings for trespassing of the charged particle beam through the two or more openings. The plurality of wires including at least a first wire having a first connector configured to provide a first voltage to the first wire; and a second wire having a second connector configured to provide a second voltage to the second wire. The second voltage is different than the first voltage.

A spherical aberration of a lens, deviating from linear optics, provides a deflection angle proportional to the third power of the distance to the axis. For example, a deflection angle can have a first proportionality to a distance to an axis, and a second proportionality to the third power of the distance to the axis and having rotational symmetry around the axis. The axis refers to the main optical axis of the system. Correctors can compensate the spherical aberration, i.e. the third power deviation from linear optics. The correctors are configured to provide an angle of correction proportional to a distance to an axis and proportional to the third power of the distance to the axis and having rotational symmetry around the axis. The correctors effect the correction via the deflectors. The deflectors can correspond to the plurality of wires.

According to the present disclosure, different embodiments of correctors are provided to provide an angle of correction proportional to the third power of the distance to the axis. The different embodiments of the corrector can include different deflectors. For example, line deflectors can be provided to approximate the correction of third order. According to some embodiments, which can be combined with other embodiments described herein, a combination of line deflectors and an octupole can be provided. Line deflectors combined with an octupole can better approximate the third order correction, particularly the third order correction can be better compensated in various directions. Line deflectors with an octupole can provide a higher rotational symmetry of the aberration correction. According to another embodiment, cylindrical deflectors with cylindrical wires can be provided. The cylindrical wires of the cylindrical deflector can be coaxial cylindrical wires. Cylindrical deflectors might be more difficult to build, but allow to approximate the third order aberration correction even better. A symmetry of the cylindrical deflectors substantially corresponds to a symmetry of the circular lenses.

Embodiments of correctors for spherical aberration correction including line deflectors, line deflectors in combination with an octupole, or cylindrical deflectors have multiple advantages. The correctors can be implemented with MEMS technology. The correctors are comparatively easy and cheap to build. Wire Deflectors, such as line deflectors including wires or cylindrical deflectors including cylindrical wires, have, additionally or alternatively, the advantage of allowing a larger transparency, as, for example, compared with Einzel lenses. Wire deflectors may minimize or reduce the current loss. The electronics requirements are expected to be lower than for a conventional aberration corrector. Compared to multi-pole correctors, the corrector is much shorter and easier to implement in a high energy beam. An advantage for apparatuses with large beam currents, which suffer from electron-electron interactions, can be provided.

Throughout this disclosure the term wire refers to a thread or slender rod. The wires can be made of conductive or semi-conductive material. The wires can be made, for example, from metals or semiconductors. The wires can also be 2D materials, for example, the wires can be carbon-nanotubes.

Correcting spherical aberrations of a charged particle system, in particular an electron beam system, can lead to an improvement in resolution or current density and therefore generally improve the performance of the system. The resolution of a charged particle beam microscope can be improved. Enabling a cost-effective aberration corrector enables the implementation in different tools.

Figure 1:
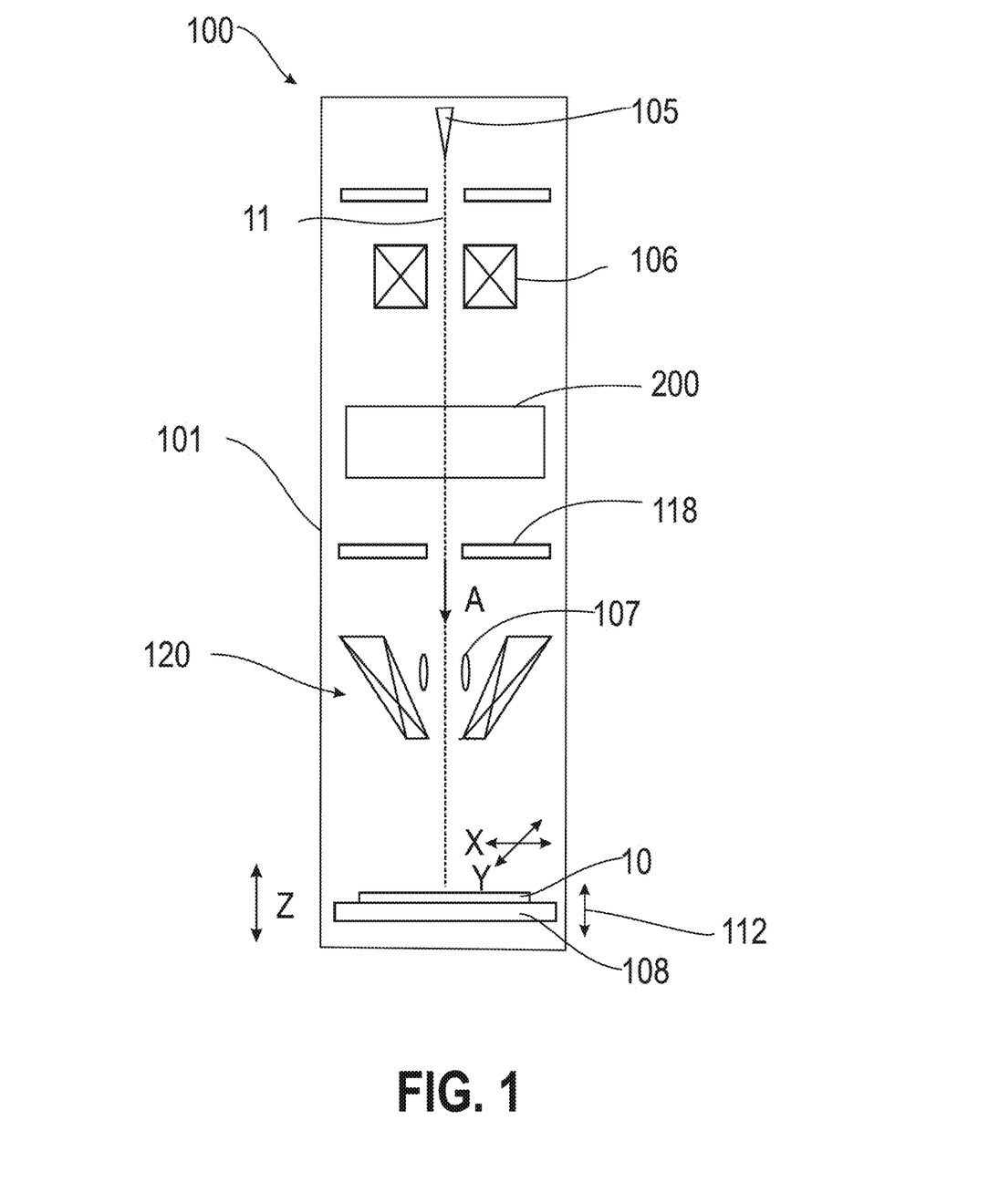
FIG. 1 shows a schematic view of a charged particle system according to embodiments described herein.

FIG. 1 is a schematic view of a charged particle beam system 100 for inspecting and/or imaging a sample 10 according to embodiments described herein. The charged particle beam system 100 includes a charged particle source 105. The charged particle source can be configured to emit a charged particle beam 11. The charged particle beam may be an electron beam. The charged particle beam may propagate along an optical axis A. The charged particle beam system 100 further includes a sample stage 108 and a focusing lens 120. The sample can be placed on the sample stage 108. The focusing lens may be an objective lens. The focusing lens can focus the charged particle beam 11 on the sample 10. The charged particle beam system 100 further includes a corrector 200 for correcting aberrations of the charged particle beam according to embodiments described herein. The charged particle beam system 100 further includes a charged particle detector 118, particularly an electron detector. The charged particle detector 118 can detect signal particles emitted from the sample 10. The charged particle detector 118 can detect signal electrons, for example, secondary electrons and/or backscattered electrons.

An image generation unit (not shown) may be provided. The image generation unit can be configured to generate one or more images of the sample 10. The image generation unit can generate the one or more images based on the signal received from the charged particle detector 118. The image generation unit can forward the one or more images of the sample to a processing unit (not shown). The processing unit can be configured to determine actual values of beam aberration coefficients therefrom.

The sample stage 108 may be a movable stage. In particular, the sample stage 108 may be movable in the Z-direction, i.e., in the direction of the optical axis A, such that the distance between the focusing lens 120 and the sample stage 108 can be varied (see arrow 112 in FIG. 1). By moving the sample stage 108 in the Z-direction, the sample 10 can be moved to different "working distances". Further, the sample stage 108 may also be movable in a plane perpendicular to the optical axis A (also referred to herein as the X-Y-plane). By moving the sample stage 108 in the X-Y-plane, a specified surface region of the sample 10 can be moved into an area, e.g. a field of view (FOV), below the focusing lens 120, such that the specified surface region can be imaged by focusing the charged particle beam 11 thereon.

The beam-optical components of the charged particle beam system 100 can be placed in a vacuum chamber 101 that can be evacuated. A vacuum can be beneficial for propagation of the charged particle beam 11, for example, along the optical axis A from the charged particle source 105 toward the sample stage 108. The charged particle beam may hit the sample 10 under a sub-atmospheric pressure, e.g. a pressure below $10^{-3}$ mbar or a pressure below $10^{-5}$ mbar.

For example, the charged particle beam system 100 may be an electron microscope, particularly a scanning electron microscope. A scan deflector 107 may be provided for scanning the charged particle beam 11 over a surface of the sample 10 along a predetermined scanning pattern, for example, in the X-direction and/or in the Y-direction.

A condenser lens system 106 may be arranged downstream of the charged particle source 105. The condenser lens system 106 can collimate the charged particle beam 11 propagating toward the focusing lens 120. For example, the focusing lens 120 can be an objective lens configured to focus the charged particle beam 11 on the sample 10. The focusing lens, can be, for example, a magnetic objective lens, an electrostatic lens, or a combined magnetic-electrostatic lens.

One or more surface regions of the sample 10 can be inspected and/or imaged with the charged particle beam system 100. The term "sample" as used herein may relate to a substrate, for example, with one or more layers or features formed thereon, a semiconductor wafer, a glass substrate, a flexible substrate, such as a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

For inspecting the sample 10 with the charged particle beam 11, the charged particle beam 11 can be focused on a sample surface with the focusing lens 120. The corrector 200 can correct spherical aberration of the charged particle beam. Focusing of the focusing lens 120 can be improved by correcting spherical aberration. Focusing of the focusing lens 120 can be improved by the corrector 200. Secondary electrons and/or backscattered electrons (referred to as "signal electrons") are emitted from the sample when the charged particle beam 11 impinges on the sample surface. The signal electrons provide information about spatial characteristics and dimensions of features of the sample. The signal electrons can be detected with the charged particle detector 118. The charged particle beam 11 can be scanned over the sample surface, e.g. with the scan deflectors 107. The signal electrons can be detected as a function of time and, thus, the generation position of the signal electrons can be determined. The sample surface or a portion thereof can be imaged, e.g., with the image generation unit that may be configured to provide an image of the sample 10 based on the received signal electrons.

According to an embodiment, a charged particle beam apparatus is provided. The charged particle beam apparatus can, for example, be a charged particle beam scanning microscope. The charged particle beam scanning microscope including a sample stage; a charged particle source adapted to generate a charged particle beam; and a charged particle beam manipulation system including the aberration corrector according to embodiments described herein.

In some embodiment the charged particle beam scanning microscope includes an octupole oriented such that one symmetry axis is along the first direction. Particularly, the octupole can be an electrostatic octupole.

In charged particle beam systems, beam aberrations can lead to an enlarged or deformed beam cross section, which reduces the resolution. For example, spherical aberrations in the system, which can be introduced by lenses, lead to an enlarged focus beam cross section in the focal plane. The focal plane can, for example, correspond to the surface of the substrate.

Figure 2:
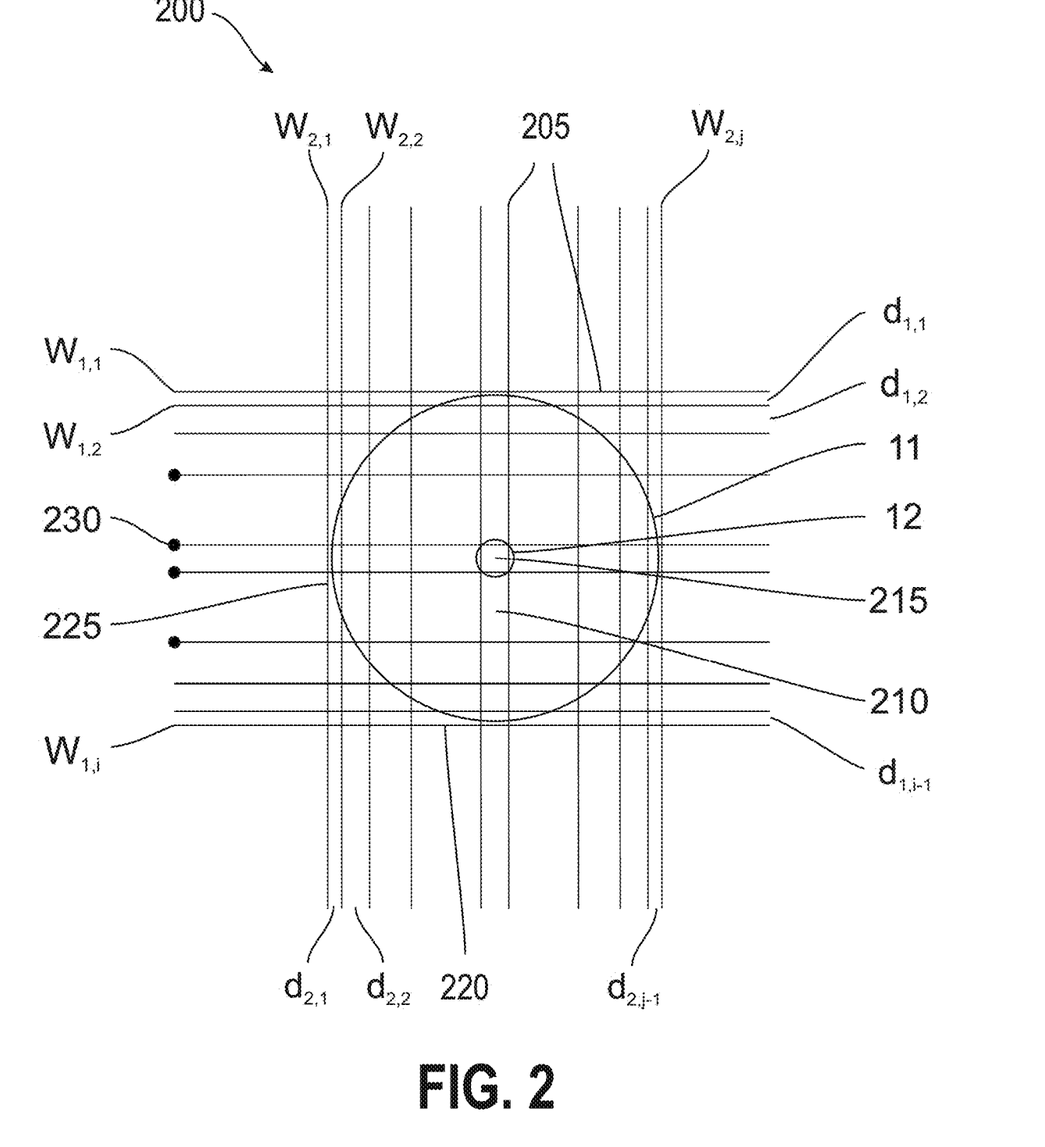
FIG. 2 shows a schematic view of a corrector having line deflectors according to embodiments described herein.

FIG. 2 shows a schematic view of a corrector 200 including line deflectors for correcting aberration of a charged particle beam 11 according to embodiments described herein. The corrector 200 includes a plurality of wires 205. The wires correspond to the line deflectors. The plurality of wires may include a first set of wires 220 extending along a first direction including i wires and a second set of wires 225 extending along a second direction including j wires. In FIG. 2 the wires of the first set of wires are shown to extend essentially perpendicular to the wires of the second set of wires. Wires extending along the first direction are extending along the first direction in a straight manner. Wires extending along the second direction are extending along the second direction in a straight manner. The wires of the first set of wires 220 and the wires of the second set of wires 225 cross each other in a perpendicular manner and create a perpendicular mesh. Beneficially, a symmetric orientation of the wires in a perpendicular mesh improves correction of spherical aberration of a charged particle beam. In embodiments, one or more wires of the first set of wires can extend at an angle relative to one or more wires of the second set of wires. The wires of the first set of wires and the wires of the second set of wires may create a mesh with an angle of at least 80° to each other. Typically the wires of the first set of wires and the wires of the second set of wires create a mesh with an angle of 90° to each other.

The wires can be provided with connectors 230. At least one connector can be provided for wires, for example, for each wire, of the plurality of wires 205. The corrector 200 includes i+j wires. At least one connector can be provided for each of the i+j wires. The at least i+j connectors can provide i+j voltages to the i+j wires. In some embodiment, i can be equal to j.

For correctors with line deflectors, the following denomination will be adhered to unless otherwise indicated. Wires included in the first set of wires 220 are denominated $W_{1,1}$-$W_{1,i}$. The wires $W_{1,n-1}$, $W_{1,n}$ and $W_{1,n+1}$ are direct neighboring wires for all n. Similarly, wires included in the second set of wires 225 are denominated $W_{2,1}$-$W_{2,j}$. The wires $W_{2,n-1}$, $W_{2,n}$ and $W_{2,n+1}$ are direct neighboring wires for all n. The voltage provided to the wires 205 can be denominated based on the first set of wires and the second set of wires. Accordingly, voltages applied to the wires are denominated $V_{1,1}$-$V_{1,i}$, for $W_{1,1}$-$W_{1,i}$, respectively and $V_{2,1}$-$V_{2,j}$ for $W_{2,1}$-$W_{2,j}$ respectively. A distance between neighboring wires included in the first set of wires 220 is denominated $d_{1,1}$-$d_{1,i-1}$. The distance $d_{1,m}$ corresponds to the distance between $W_{1,m}$ and $W_{1,m+1}$. Accordingly, a distance between neighboring wires included in the second set of wires is denominated as $d_{2,1}$-$d_{2,j-1}$. The distance $d_{2,m}$ corresponds to the distance between $W_{2,m}$ and $W_{2,m+1}$.

The wires 205 form two or more openings 210. One opening 215 of the two or more openings is configured to be aligned with a center 12 of the charged particle beam 11. According to embodiments of the present disclosure, an alignment with the center is understood as an alignment with a displacement of maximum 25%, particularly a displacement of maximum 10%, of the diameter of the charged particle beam in the plane of the corrector, a displacement within a predetermined alignment range, and/or an alignment within a range of alignment capability. An opening corresponding to the center of the corrector can be defined by two center wires of the first set of wires and two center wires of the second set of wires. The two center wires of the first set of wires are the wires $W_{1,i/2}$ and $W_{1,i/2+1}$, and the two center wires of the second set of wires are the wires $W_{2,j/2}$ and $W_{2,j/2+1}$.

The opening corresponding to the center of the corrector can correspond to the one opening 215 configured to be aligned with a center of the charged particle beam. In an embodiment, which can be combined with other embodiments described herein, the corrector 200 is rotational symmetric. The corrector 200 can be rotational symmetric around the opening 215 configured to be aligned with the center 12 of the charged particle beam 11. In particular, the corrector 200 has a 4-fold rotational symmetry. The corrector can be mirror-symmetric around a plane through the center 12 of the charged particle beam 11. The corrector 200, which is exemplarily shown in FIG. 2, may provide an approximation of a third order correction function with a 4-fold rotational symmetry around the opening 215 configured to be aligned with the center 12 of the charged particle beam 11. Correcting spherical aberration with a rotational symmetry approximating the rotational symmetry of the circular lens can be favorable. For example, the lens can be electrostatic, magnetic or a combined electrostatic-magnetic.

In some embodiments, the wires of the first set of wires 220 and the wires of the second set of wires 225 are spaced apart by a non-equidistant distance. For example, one or more non-equidistant distances can be smaller towards the edge of the corrector.

A wire density can at least partially increase with increasing distance from the opening 215 configured to be aligned with the center of the beam. For example, the non-equidistant distances can be configured to approximate first order and a third order correction function.

In some embodiments, which can be combined with other embodiments described herein, the corrector 200 includes a first set of wires 220 extending along a first direction and a second set of wires 225 extending along a second direction. The first set of wires 220 has a first center line oriented along the first direction and the second set of wires 225 has a second center line oriented along the second direction. The wires of the first set of wires 220 can be mirror symmetric to the first center line. The wires of the second set of wires 225 can be mirror symmetric to the second center line. It can be beneficial for aberration correction, to provide the wires of the first set of wires and/or the wires of the second set of wires mirror symmetric to the respective center line to provide a mirror symmetric aberration correction.

The plurality of wires 205 are not in direct contact and/or are electrically isolated from each other. For example, the wires of the first set of wires 220 extending along the first direction lie in a first plane. The wires of the second set of wires 225 extending along the second direction lie in a second plane. The orientation of the first plane can be defined by the first direction and the second direction. The orientation of the second plane can be defined by the first direction and the second direction. The first plane and the second plane can be parallel to each other. The first plane and the second plane can be spaced apart in a direction perpendicular to the first plane and/or the second plane.

According to some embodiments, which can be combined with other embodiments described herein, a corrector for correcting aberrations of a charged particle beam in a charged particle beam device is provided. The corrector includes a plurality of wires 205 configured to be in a plane perpendicular to a beam axis, the wires forming two or more openings 210 for trespassing of the charged particle beam 11 through the two or more openings 210. The plurality of wires 205 includes at least a first wire having a first connector 230 configured to provide a first voltage to the first wire, and a second wire having a second connector 230 configured to provide a second voltage to the second wire. The second voltage being different than the first voltage. In an embodiment, which can be combined with other embodiments described herein, one opening 215 of the two or more openings 210 is configured to be aligned with a center 12 of the charged particle beam 11. In an embodiment, which can be combined with other embodiments described herein, each wire 205 included in the plurality of wires is having a connector 230 configured to provide a voltage. For example, a corrector with five, ten or more wires includes five, ten or more connectors to apply five, ten or more voltages to each wire.

The voltages applied to the wires may generate an electrical field that approximates a first proportionality to a distance to an axis, a second proportionality to the third power of a distance to the axis and having rotational symmetry around the axis. The electrical field may deflect charged particles by a deflection angle, the deflection angle has a first proportionality to a distance to an axis, a second proportionality to the third power of a distance to the axis and having rotational symmetry around the axis.

In an embodiment, which can be combined with other embodiments described herein, the wires are provided in a micro-electromechanical systems (MEMS) structure.

In some embodiments, which can be combined with other embodiments, the plurality of wires have a diameter of 1 μm or below. Particularly, the plurality of wires are carbon nanotubes. Beneficially, wires with a diameter of 1 μm or below are used in MEMS systems. Carbon nanotubes can be mounted on a MEMS holder.

In some embodiments, which can be combined with other embodiments, the plurality of wires 205 includes a first set of wires 220 extending along a first direction and a second set of wires 225 extending along a second direction perpendicular to the first direction. The first set of wires 220 and the second set of wires 220 can be overlapping to form a grid or mesh. The number of wires in the first set of wires 220 can correspond to the number of wires in the second set of wires 225. Wires of the first set of wires are extending in a straight line along the first direction. Wires of the second set of wires are extending in a straight line along the second direction.

According to one embodiment, which can be combined with other embodiments described herein, the wires extend straight and outward of the charged particle beam and are supported by a support structure. The support structure can be a plate oriented perpendicular to the charged particle beam axis.

For example, wires of the first set of wires can be spaced apart along the second direction by a non-equidistant distances. Two or more of the non-equidistant distances can be smaller towards the edge of the corrector or the wire density can be at least partially increasing with increasing distance from the opening configured to be aligned with the center of the beam. Further, the non-equidistant distances can be configured to approximate a third order correction function.

The first direction and the second direction can be perpendicular to each other.

Figure 3:
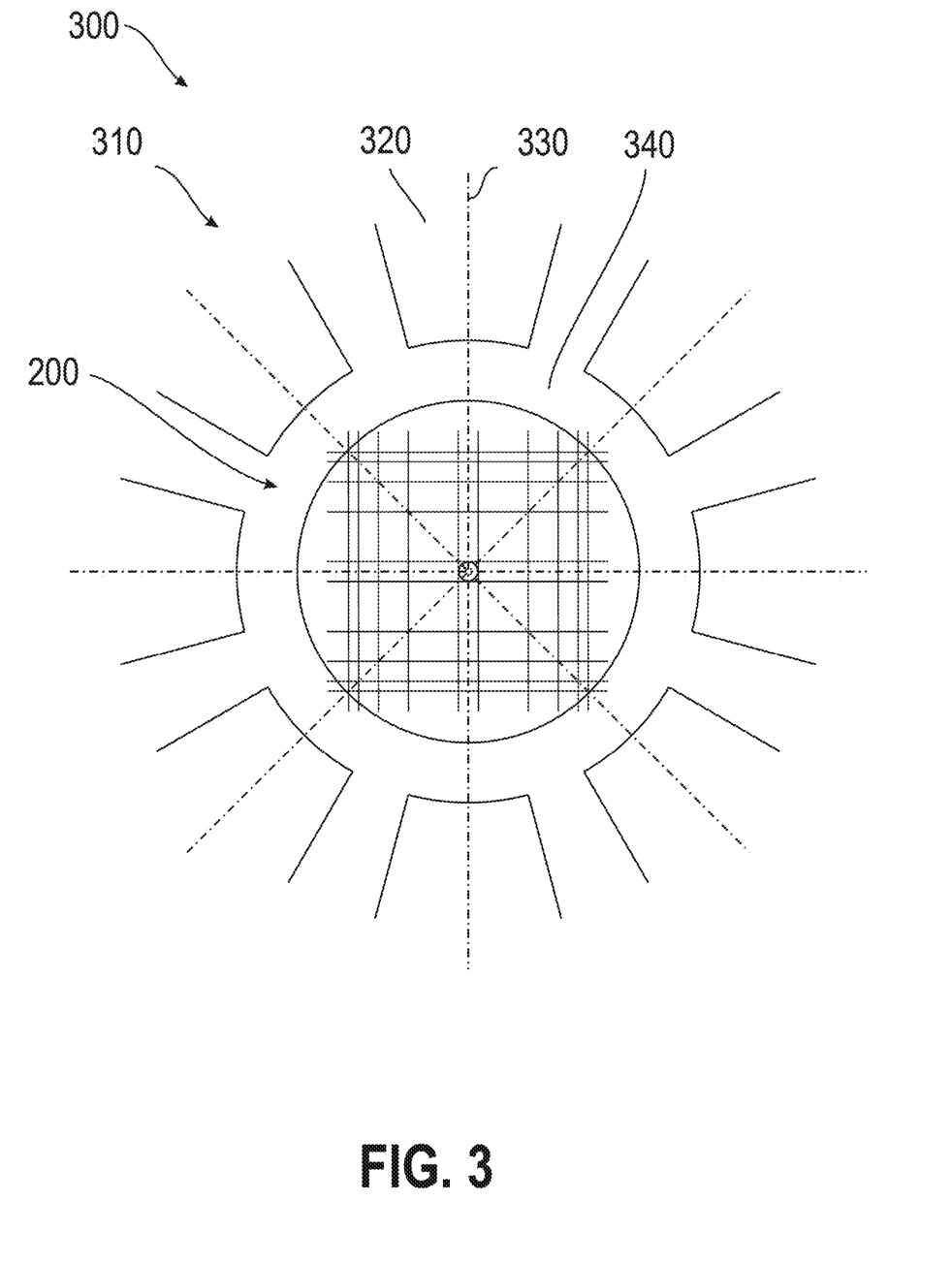
FIG. 3 shows a schematic view of a corrector having line deflectors and an octupole according to embodiments described herein.

FIG. 3 shows a schematic view of a corrector 300 including line deflectors and an octupole 310. The line deflectors essentially correspond to the line deflectors described above by embodiments with respect to FIG. 2. The line deflectors are implemented by wires.

A corrector including line deflectors according to embodiments described herein is configured to correct spherical aberration. The corrector can have wires extending along a first direction and wires extending along a second direction. The wires correspond to the line deflectors. Along the first direction and the second direction, the third order correction can be approximated by the wires extending along the first direction and the wires extending along the second direction respectively. Along a third direction the aberration correction can be approximated by a superposition of the aberration correction in the first direction and the aberration correction in the second direction, for example, by the correction of the wires extending along the first direction and the correction of the wires extending along the second direction. The third direction is not corresponding to the first direction and not corresponding to the second direction. For example, the third direction can be 45° degrees with respect to the first direction and/or the second direction or the third direction can be another direction, which is different from the first direction and different from the second direction. Aberration correction by superposition can result in increased residual aberration after correction.

An octupole can be oriented to correct aberration along a direction other than the first direction and the second direction. An octupole can correct aberration along the third direction. An octupole can correct the approximation of the third order correction along the third direction. An octupole can decrease and/or minimize residual aberration after correction along the third direction.

The octupole 310 comprises eight poles 320 forming four pairs of two poles. Poles from a pair are placed diametrically opposite around a center opening 340 of the octupole. The octupole 310 comprises four symmetry axis 330 which are each oriented at a 45° angle to each other. Particularly, the four symmetry axis 330 are oriented at angles of 0°, 45°, 90° and 135° respectively. Each pair is placed along one of the four symmetry axis 330. The octupole comprises four pairs of two poles. The eight poles are located at 0°, 45°, 90°, 135°, 180°, 225°, 270° and 315°.

The corrector 300 including a set of line deflectors and the octupole 310 can provide improved correction of aberration along the third direction. The corrector 300 can have a 4-fold symmetry. The corrector including line deflectors and an octupole according to embodiments described herein can provide approximation of a third order correction function with high rotational symmetry, for example, 8-fold rotational symmetry, around the one opening configured to be aligned with the center 12 of the charged particle beam 11. The corrector including line deflectors and an octupole can better approximate the rotational symmetry of the circular lens. The corrector including line deflectors and an octupole can provide an approximation of a third order correction function better approximating the rotational symmetry of the circular lens.

In some embodiments, which can be combined with other embodiments, the octupole 310 is oriented such that one symmetry axis 330 is along the first direction and/or a second symmetry axis 330 is along the second direction. The octupole 310 can be an electrostatic octupole. Particular, a third symmetry axis 330 is oriented at an 45° angle to the first direction and/or the second direction. The third symmetry axis 330 can be along the third direction. An orientation along the first direction and/or the second direction corresponds to an angular range around 0° such as 0°±10° or less, 0°±5° or less, 0°±1° or less, 0°±0.5° or less, 0°±0.1° or less.

The plurality of wires and the octupole 310 may not be in direct contact and/or may be electrically isolated from each other. Wires of the first set of wires extending along a first direction may lie in a first plane. The wires of the second set of wires extending along a second direction may lie in a second plane. The octupole may lie in a third plane. The orientation of the first plane can be defined by the first direction and the second direction. The orientation of the second plane can be defined by the first direction and the second direction. The orientation of the third plane can be defined by the first direction and the second direction. The first plane and the second plane can be parallel to each other. The first plane and the third plane can be parallel to each other. The second plane and the third plane can be parallel to each other. The first plane and the second plane can be spaced apart in a direction perpendicular to the first plane and/or the second plane. Alternatively, the first plane can be in close proximity to the second plane. Further, the second plane and the third plane can be spaced apart in a direction perpendicular to the second and/or the third plane. The second plane and the third plane can be spaced apart by more than 100 μm.

Figure 4:
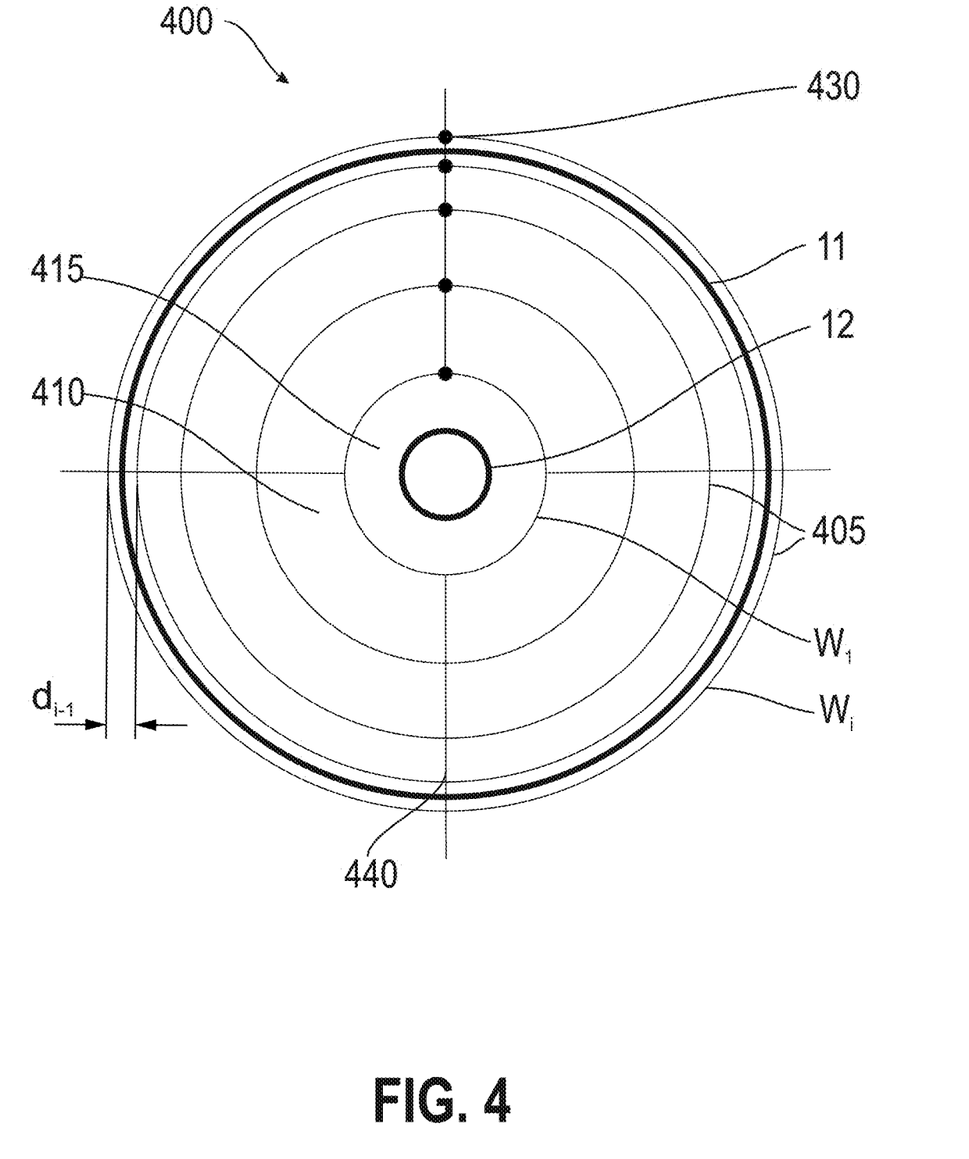
FIG. 4 shows a schematic view of a corrector having cylindrical deflectors according to embodiments described herein.

FIG. 4 is a perspective view of a corrector 400 including cylindrical deflectors for aberration correction according to embodiments described herein. The cylindrical deflectors can be implemented by cylindrical wires. The corrector 400 includes a plurality of wires 405 forming closed loops. The corrector 400 further includes a support structure 440. The support structure can be a plurality of radially extending wires connected to the plurality of wires 405, as shown in FIG. 4. A charged particle beam 11 is trespassing the cylindrical deflector, the center of the charged particle beam is aligned with a center opening 415 configured to be aligned with a center 12 of the charged particle beam 11. According to some embodiments, which can be combined with other embodiments described herein, the plurality of wires 405 are concentric.

When referring to embodiments of correctors including cylindrical deflectors, the following denomination will be adhered to unless otherwise indicated. The wires are denominated $W_1$-$W_i$. The wires $W_{n-1}$, $W_n$ and $W_{n+1}$ are direct neighboring wires for all n. The wire $W_1$ denotes the most inside wire and $W_i$ denotes the most outside wire. A distance between neighboring wires is denominated $d_1$-$d_{i-1}$. The distance $d_m$ is the distance between $W_m$ and $W_{m+1}$. Voltages applied to the wires are denominated $V_{1,1}$-$V_{1,i}$, for the voltages applied to the wires $W_1$-$W_i$ respectively.

According to some embodiments, which can be combined with other embodiments described herein, a corrector 400 having cylindrical deflectors for correcting aberrations of a charged particle beam in a charged particle beam device is provided. The cylindrical deflectors are implemented by wires. The corrector includes a plurality of wires 405 forming two or more openings 410 for trespassing of the charged particle beam through the two or more openings. The plurality of wires including at least a first wire having a first connector configured to provide a first voltage to the first wire and a second wire having a second connector configured to provide a second voltage to the second wire, the second voltage being different than the first voltage. One center opening 415 of the two or more openings is configured to be aligned with a center 12 of the charged particle beam. The plurality of wires can be concentric.

The two or more openings 410 can be rotational symmetric. In particular the two or more openings are having a circular symmetry essentially corresponding to the symmetry of the circular lens. It can be of advantage to provide the two or more openings 410 with a rotational symmetry corresponding to the rotational symmetry of the charged particle beam 11 to provide symmetric aberration correction.

In some embodiments, which can be combined with other embodiments described herein, the wires are provided in a micro-electromechanical systems (MEMS) structure.

In some embodiments, which can be combined with other embodiments described herein, each wire of the plurality of wires forms a closed loop. In particular, the plurality of wires 405 are concentric and each of the plurality of wires form a closed loop. Correctors having cylindrical deflectors include a rotational symmetry essentially corresponding to the rotational symmetry of the circular lens. The corrector 400 can provide for improved aberration correction of a charged particle beam and beneficially increases resolution of a system implementing a charged particle beam.

In some embodiments, which can be combined with other embodiments described herein, the corrector 400 includes a support structure 440 configured to support the plurality of wires. For example, the plurality of wires are attached to the support structure 440. The support structure 440 can be at least one wire extending substantially radially to support each of the plurality of wires 405.

In some embodiments, which can be combined with other embodiments described herein, the support structure includes one or more connection wires.

In some embodiments, which can be combined with other embodiments described herein, the support structure includes a plurality of connectors (not shown) electrically coupled to the plurality of wires 405. For example, the support structure includes one connector for each connector 430 included in the plurality of wires. In particular, the support structure can be separately connected to each wire of the plurality of wires. The support structure can be electrically and separately coupled to each connector 430 by the plurality of connectors. The connectors can provide different voltages to each wire of the plurality of wires.

The most inside wire $W_1$ may correspond to a center wire. The center wire forms an opening. The opening formed by the center wire $W_1$ corresponding to the center opening of the corrector. The center opening can be configured to be aligned with a center 12 of the charged particle beam 11. The opening formed by the center wire $W_1$ is corresponding to the one center opening 415 configured to be aligned with a center 12 of the charged particle beam 11. The center opening 415 can be configured that the center 12 of the charged particle beam 11 lies in the center opening.

The rotational symmetry of the cylindrical corrector corresponds to the rotational symmetry of the charged particle beam 11. The corrector 400, e.g. a cylindrical corrector, can generate an electrical field that approximates a first proportionality to a distance to an axis, a second proportionality to the third power of a distance to the axis and having rotational symmetry around the axis. The electrical field may deflect charged particles by a deflection angle, the deflection angle has a first proportionality to a distance to an axis, a second proportionality to the third power of a distance to the axis and having rotational symmetry around the axis. A corrector having cylindrical deflectors can correct aberration in a charged particle beam in all direction with accuracy.

The plurality of wires 405 and the support structure 440 are in direct contact. The support structure is electrically connected to each wire of the plurality of wires by a plurality of connectors. The plurality of connectors are electrically isolated from each other. The plurality of wires 405 are electrically isolated from each other. The wires of the plurality of wires may lie in a first plane or the wires of the plurality of wires 405 may lie in different planes. The planes are oriented parallel to each other and spaced apart in a perpendicular direction. The plurality of wires may extend along a direction substantially perpendicular to the plane of the plurality of wires.

Figure 5A:
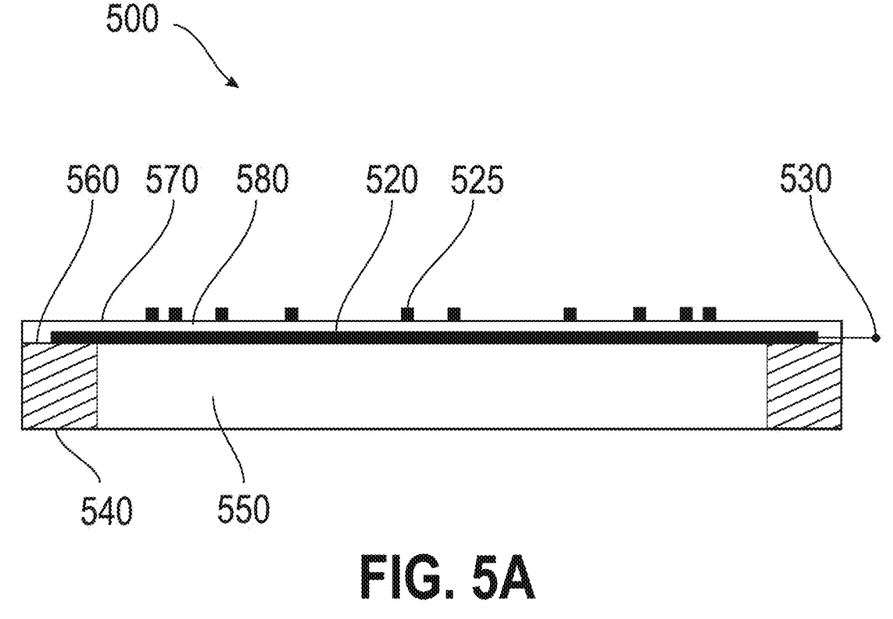
FIG. 5A shows a schematic view of a corrector according to embodiments described herein, implemented in a micro-electromechanical system (MEMS).

FIG. 5A shows a schematic view of corrector including line deflectors according to embodiments described herein implemented in a micro-electromechanical system (MEMS) 500. The corrector includes a base structure 540 with an opening 550. A plurality of wires is supported by the base structure 540. The plurality of wires includes a first set of wires 520 extending along a first direction and a second set of wires 525 extending along a second direction. The wires having connectors 530 configured to provide a voltage to the respective wire. The wires of the first set of wires 520 and the wires of the second set of wires 525 can be supported by the base structure 540. The wires of the first set of wires 520 and the wires of the second set of wires 525 can be supported on essentially opposite sides of the opening 550 in a way that the wires extended over the opening 550. The base structure includes a first surface 560, the first surface 560 is configured to support wires of the first set of wires. The base structure includes an elevated platform 580. The platform 580 includes a second surface 570, the second surface 570 is configured to support wires of the second set of wires.

The wires of the first set of wires 520 and the wires of the second set of wires 525 can be overlapping. The wires of the first set of wires 520 and the wires of the second set of wires 525 can form a grid.

A cylindrical deflector corrector can be implemented in a MEMS. The base structure 540 can be configured to support the support structure 440 of the cylindrical deflector.

Figure 5B:
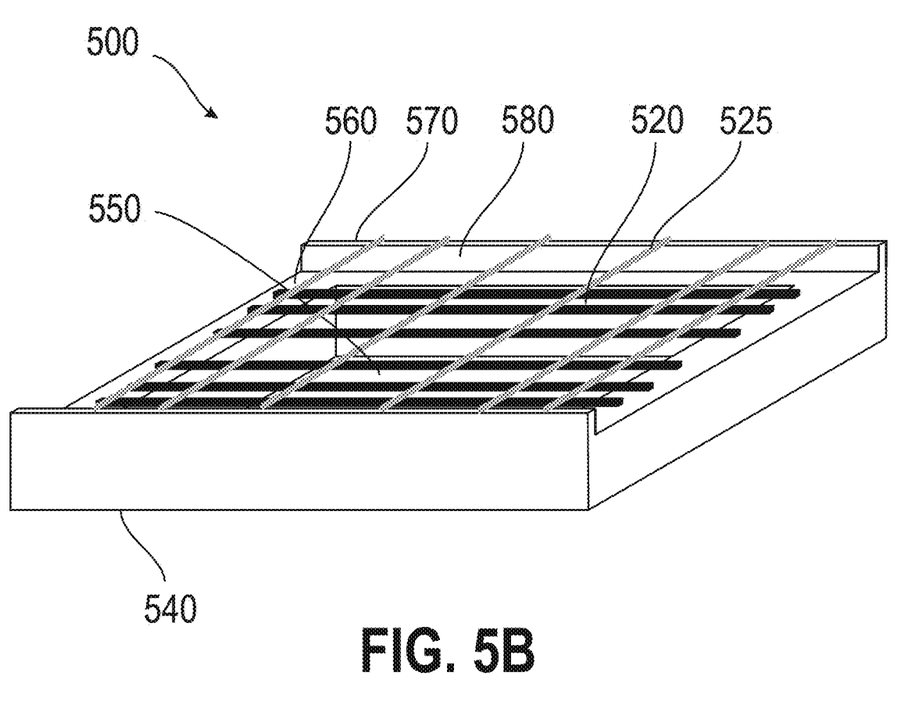
FIG. 5B shows a perspective view of a corrector according to embodiments described herein, implemented in a micro-electromechanical systems (MEMS).

FIG. 5B shows a perspective view of a corrector including line deflectors according to embodiments described herein, implemented in a micro-electromechanical systems (MEMS).

It can be advantageous to implement the correctors described by embodiments herein in MEMS structures. For example, MEMS can be provided on a wafer. MEMS fabrication is extremely scalable and has very low costs per unit in mass fabrication. When implementing the correctors in a MEMS structure, the wires can be carbon nanotubes, tungsten wires or metal covered silicon wires, for example, molybdenum covered silicon wires. Implementing the correctors in MEMS allows for increased wire density. High wire densities can improve the accuracy and control of aberration correction of the charged particle beam.

Figure 6:
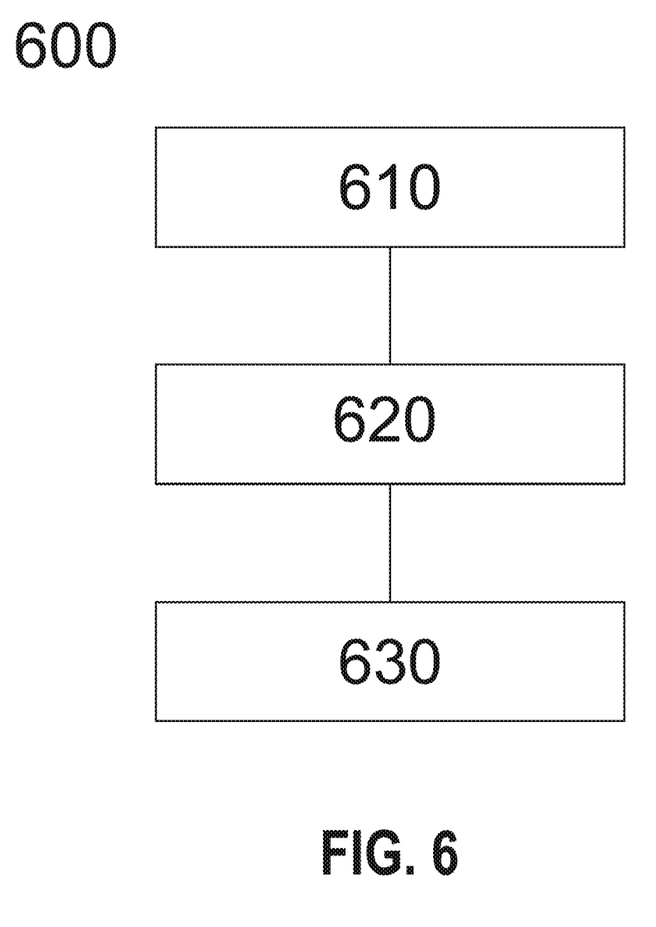
FIG. 6 shows a flow chart illustrating a method of correcting aberration of a charged particle beam in a charged particle beam system according to embodiments described herein.

FIG. 6 shows a diagram illustrating a method 600 of correcting aberration of a charged particle beam in a charged particle beam system according to embodiments described herein.

According to an embodiment, a method 600 of correcting spherical aberrations with a corrector is given. The method includes providing a plurality of voltages 610 to a plurality of wires to generate an electrical field that approximates a first proportionality to a distance to an axis, a second proportionality to the third power of the distance to the axis and having rotational symmetry around the axis; generating a charged particle beam 620; and guiding 630 the charged particle beam along the axis through two or more openings provided by the plurality of wires.

In some embodiments, which can be combined with other embodiments described herein, a method of correcting spherical aberrations according to embodiments described herein is with a corrector 200, 300, 400 according to embodiments described herein.

In some embodiments, which can be combined with other embodiments described herein, the electrical field deflects charged particles by a deflection angle, the deflection angle may have a first proportionality to a distance to the axis, a second proportionality to the third power of a distance to the axis and having rotational symmetry around the axis.

In some embodiments, which can be combined with other embodiments, a method of correcting aberrations of a charged particle beam in a charged particle beam device with a corrector according to embodiments described herein is given. The method includes aligning the opening configured to be aligned with the center of the charged particle with the charged particle beam and applying a voltage to at least the first wire and the second wire.

In some embodiments, which can be combined with other embodiments described herein, the method includes applying a voltage to each wire of the plurality of wires 205, 405. Further, the respective voltage applied to each wire of the plurality of wires may be increasing with increasing distance of the wire from the opening configured to be aligned with the center of the beam. Particularly, the voltage portion applied to a respective wire of the plurality of wires, which is provided to correct a third order correction, particularly in addition to a first order correction, may be higher than the voltage applied to a wire closer to the opening configured to aligned with the center of the beam. For example, the voltage applied to each wire is increased to approximate a third order correction function.

For example, the corrector includes a first set of wires extending along a first direction and a second set of wires extending along a second direction. The first set of wires has a center line oriented along the first direction and the second set of wires has a center line oriented along the second direction. It can be beneficial to apply the same voltage to wires which are mirror symmetric to the center line to provide a symmetric aberration correction.

Correctors according to embodiments described herein are easily implemented into a charged particle system. The correctors have low voltage requirements and allow for high currents of the charged particle beam. Spherical aberration correction with the correctors according to embodiments described herein focuses the charged particle beam. The correctors described herein by embodiments enable a cost-effective aberration correction, which can readily be implemented in different products and improve the performance of a charged particle beam system, for example, by improving the resolution.

Compared with the prior art, there is no on-axial wire to block an axial portion of the beam. Compared with conventional aberration correctors, the correctors according to embodiments described herein provide a cheaper and less complex way to correct spherical aberrations. The correctors according to embodiments described herein is also much shorter in length, which is beneficial at high beam. currents where electron-electron interaction dominates the performance. The electronics requirements are lower than for a conventional aberration corrector.

In some embodiments, which can be combined with other embodiments described herein, the corrector includes concentric wires.

Embodiments of the present disclosure may include the following clauses.

Clause 1: A corrector for correcting aberrations of a charged particle beam in a charged particle beam device, including: a plurality of wires configured to be in a plane perpendicular to a beam axis, the wires forming two or more openings for passing of the charged particle beam through the two or more openings, the plurality of wires including at least: a first wire having a first connector configured to provide a first voltage to the first wire; and a second wire having a second connector configured to provide a second voltage to the second wire, the second voltage being different than the first voltage.

Clause 2. The corrector according to clause 1, wherein one opening of the two or more openings is configured to be aligned with a center of the charged particle beam.

Clause 3. The corrector according to any one of clauses 1 to 2, wherein the wires extend straight and outward of the charged particle beam and are supported by a support structure.

Clause 4. The corrector according to any one of clauses 1 to 3, wherein the corrector is rotational symmetric.

Clause 5. The corrector according to any of clauses 1 to 4, wherein the plurality of wires includes: a first set of wires extending along a first direction; and a second set of wires extending along a second direction perpendicular to the first direction.

Clause 6. The corrector according to clause 5, wherein wires of the first set of wires are spaced apart along the second direction by non-equidistant distances.

Clause 7. The corrector according to clause 6, wherein two or more of the non-equidistant distances are smaller towards an edge of the corrector or wherein wire density is at least partially increasing with increasing distance from an opening configured to be aligned with the center of the charged particle beam.

Clause 8. The corrector according to any of clauses 6 to 7, wherein the non-equidistant distances are configured to approximate a third order correction function.

Clause 9. The corrector according to any of clauses 1 to 2, wherein the plurality of wires are concentric.

Clause 10. The corrector according to clause 9, wherein one or more wires of the plurality of wires forms a closed loop.

Clause 11. The corrector according to any one of clauses 9 or 10, further including a support structure configured to support the plurality of wires.

Clause 12. The corrector according to clause 10, wherein the support structure includes one or more connection wires.

Clause 13. The corrector according to any one of clauses 11 to 12, wherein the support structure includes a plurality of connectors electrically coupled to the plurality of wires.

Clause 14 The corrector according to any of clauses 1 to 13, wherein the plurality of wires are provided in a MEMS structure.

Clause 15. The corrector of any one of clauses 1 to 14, wherein the plurality of wires have a diameter of 1 µm or below.

Clause 16. The corrector of any one of clauses 1 to 15, wherein the plurality of wires are one of carbon nanotubes, tungsten wires or metal covered silicon wires.

Clause 17. The corrector according to any of clauses 5 to 8, further including: an octupole oriented such that one symmetry axis is along the first direction.

Clause 18. A charged particle beam apparatus including: a sample stage; a charged particle source adapted to generate a charged particle beam; and a charged particle beam manipulation system including an aberration corrector according to any one of clauses 1-17.

Clause 19. The charged particle beam apparatus of clause 18, further including: an octupole oriented such that one symmetry axis is along the first direction, particularly an electrostatic octupole.

Clause 20. A method of correcting spherical aberrations with a corrector, including: providing a plurality of voltages to a plurality of wires to generate an electrical field that approximates a first proportionality to a distance to an axis, a second proportionality to the third power of a distance to the axis and having rotational symmetry around the axis; generating a charged particle beam; and guiding the charged particle beam along the axis through two or more openings provided by the plurality of wires.

Clause 21. The method of clause 20, wherein the electrical field deflects charged particles by a deflection angle, the deflection angle having a first proportionality to a distance to the axis, a second proportionality to the third power of a distance to the axis and having rotational symmetry around the axis.

Clause 22. The method according to any one of clauses 20 to 21, wherein the corrector is a corrector according to any of clauses 1 to 17.

While the foregoing is directed to embodiments, other and further embodiments may be devised without departing from the basic scope, and the scope thereof is determined by the claims that follow.

The invention claimed is:

1. A corrector for correcting aberrations of a charged particle beam in a charged particle beam device, comprising:
   a plurality of wires configured to be in a plane perpendicular to a beam axis, the wires forming two or more openings for passing of the charged particle beam through the two or more openings, the plurality of wires comprising at least:
   a first wire configured to be biased to provide a first voltage to the first wire; and
   a second wire configured to be biased to provide a second voltage to the second wire, the second voltage being different than the first voltage.

2. The corrector according to claim 1, wherein one opening of the two or more openings is configured to be aligned with a center of the charged particle beam.

3. The corrector according to claim 1, wherein the wires extend straight and outward of the charged particle beam and are supported by a support structure.

4. The corrector according to claim 1, wherein the corrector is rotational symmetric.

5. The corrector according to claim 1, wherein the plurality of wires comprises:
   a first set of wires extending along a first direction; and
   a second set of wires extending along a second direction perpendicular to the first direction.

6. The corrector according to claim 5, wherein wires of the first set of wires are spaced apart along the second direction by non-equidistant distances.

7. The corrector according to claim 6, wherein two or more of the non-equidistant distances are smaller towards an edge of the corrector or wherein wire density is at least partially increasing with increasing distance from an opening configured to be aligned with a center of the charged particle beam.

8. The corrector according to claim 6, wherein the non-equidistant distances are configured to approximate a third order correction function.

9. The corrector according to claim 1, wherein the plurality of wires are concentric.

10. The corrector according to claim 9, wherein one or more wires of the plurality of wires forms a closed loop.

11. The corrector according to claim 9, further comprising a support structure configured to support the plurality of wires.

12. The corrector according to claim 11, wherein the support structure comprises one or more connection wires.

13. The corrector according to claim 11, wherein the support structure comprises a plurality of connectors electrically coupled to the plurality of wires.

14. The corrector according to claim 1, wherein the plurality of wires are provided in a MEMS structure.

15. The corrector according to claim 1, wherein the plurality of wires have a diameter of 1 µm or below.

16. The corrector according to claim 15, wherein the plurality of wires are one of carbon nanotubes, tungsten wires or metal covered silicon wires.

17. The corrector according to claim 5, further comprising:
   an octupole oriented such that one symmetry axis is along the first direction.

18. A charged particle beam apparatus comprising:
   a sample stage;
   a charged particle source adapted to generate a charged particle beam; and
   a charged particle beam manipulation system including an aberration corrector according to claim 1.

19. The charged particle beam apparatus of claim 18, further comprising:
   an octupole oriented such that one symmetry axis is along the first direction.

20. A method of correcting spherical aberrations with a corrector, comprising:
   providing a plurality of voltages to a plurality of wires to generate an electrical field that approximates a first proportionality to a distance to an axis, a second proportionality to the third power of a distance to the axis and having rotational symmetry around the axis;
   generating a charged particle beam; and
   guiding the charged particle beam along the axis through two or more openings provided by the plurality of wires.

21. The method of claim 20, wherein the electrical field deflects charged particles by a deflection angle, the deflection angle having a first proportionality to a distance to the axis, a second proportionality to the third power of a distance to the axis and having rotational symmetry around the axis.

22. The method of claim 20, wherein the corrector is a corrector according to claim 1.

* * * * *